(12) United States Patent
Warren

(10) Patent No.: US 8,949,076 B2
(45) Date of Patent: Feb. 3, 2015

(54) REAL TIME MONITORING AND CONTROL OF COMMUNICATIONS NETWORKS AND RADIO FREQUENCY DISTRIBUTION NETWORKS

(71) Applicant: Samuel Warren, Mount Airy, MD (US)

(72) Inventor: Samuel Warren, Mount Airy, MD (US)

(73) Assignee: United States Holdings, LLC, Baltimore, MD (US)

( * ) Notice: Subject to any disclaimer, the term of this patent is extended or adjusted under 35 U.S.C. 154(b) by 0 days.

(21) Appl. No.: 13/875,360

(22) Filed: May 2, 2013

(65) Prior Publication Data

US 2013/0246005 A1  Sep. 19, 2013

Related U.S. Application Data

(63) Continuation-in-part of application No. 12/364,874, filed on Feb. 3, 2009, now abandoned.

(51) Int. Cl.
| | | |
|---|---|---|
| G06F 11/07 | (2006.01) | |
| G06F 11/30 | (2006.01) | |
| H04B 17/00 | (2006.01) | |
| G01R 31/08 | (2006.01) | |
| H04W 24/00 | (2009.01) | |
| H04L 12/26 | (2006.01) | |

(52) U.S. Cl.
CPC ............. *G06F 11/30* (2013.01); *G01R 31/08* (2013.01); *H04W 24/00* (2013.01); *H04L 43/12* (2013.01); *H04B 17/0042* (2013.01); *H04B 17/0065* (2013.01)
USPC ........................................................ 702/188

(58) Field of Classification Search
CPC ................................. G01R 31/083; H04B 3/46
See application file for complete search history.

(56) References Cited

U.S. PATENT DOCUMENTS

| | | | | |
|---|---|---|---|---|
| 4,207,431 A | * | 6/1980 | McVoy | ........................... 379/22 |
| 4,234,926 A | | 11/1980 | Wallace et al. | |
| 4,389,694 A | | 6/1983 | Cornwell | |
| 4,807,149 A | | 2/1989 | Mehnert | |
| 4,835,494 A | | 5/1989 | Preschatti | |
| 5,353,009 A | * | 10/1994 | Marsh et al. | .................. 340/505 |
| 5,483,826 A | | 1/1996 | Schultz et al. | |
| 5,790,294 A | | 8/1998 | Horiuchi et al. | |
| 6,490,063 B1 | * | 12/2002 | Imajo | .............................. 398/13 |
| 6,829,567 B2 | | 12/2004 | Michiwaki et al. | |
| 7,072,582 B2 | * | 7/2006 | Stevens | ........................... 398/38 |
| 7,254,827 B1 | | 8/2007 | Terreault | |
| 2002/0133254 A1 | | 9/2002 | Elwood et al. | |
| 2003/0009313 A1 | | 1/2003 | May et al. | |
| 2003/0022645 A1 | | 1/2003 | Runzo | |
| 2003/0046031 A1 | * | 3/2003 | Conrad et al. | ................ 702/188 |
| 2003/0114112 A1 | | 6/2003 | Strater et al. | |
| 2005/0021311 A1 | | 1/2005 | Deb et al. | |
| 2005/0110655 A1 | | 5/2005 | Layton | |
| 2007/0053311 A1 | * | 3/2007 | Kim et al. | ..................... 370/280 |
| 2008/0313694 A1 | | 12/2008 | Kudo et al. | |
| 2010/0026310 A1 | | 2/2010 | Shimp | |

* cited by examiner

*Primary Examiner* — John Breene
*Assistant Examiner* — Timothy H Hwang
(74) *Attorney, Agent, or Firm* — Laubscher & Laubscher, P.C.

(57) ABSTRACT

A system and method for monitoring a communications network having a plurality of wired communication cables is characterized by a central computer and a plurality of remote sensors connected with the cables at spaced locations for sampling data at the locations and providing an indication when a fault occurs. The central computer transmits measurement request signals to each remote sensor. In response to a request, the remote sensor samples data on the network at the unit location and sends a measurement of the sample to the central computer where the measurement is compared with baseline measurements for the location. If the measured data from the unit deviates from the baseline measurement, a fault is indicated.

11 Claims, 3 Drawing Sheets

REAL TIME MONITORING AND CONTROL OF COMMUNICATIONS NETWORKS AND RADIO FREQUENCY DISTRIBUTION NETWORKS

This application is a continuation-in-part of application Ser. No. 12/364,874 filed Feb. 3, 2009.

FIELD OF THE INVENTION

The present invention relates generally to real time monitoring and control of communications networks and radio frequency distribution networks in tunnels, subways and other underground passage ways.

BACKGROUND OF THE INVENTION

In order to be able to effectively manage the performance and maintenance of communications networks and radio frequency distribution networks in tunnels, subways and other underground passage ways, workers are required to manually inspect segments of the network for faults. Thus, the networks can be non-operational or operating below acceptable limits for an appreciable time until a fault is located and corrected. In addition the process is hazardous, inconvenient and time consuming because maintenance personnel must inspect each segment of the communications network and/or radio frequency distribution network until the faulty portion is located before any repairs can be made. The present invention was developed to provide automatic monitoring of such systems without requiring personal inspection.

SUMMARY OF THE INVENTION

According to a primary object of the invention, a system for monitoring a communications network having a plurality of communication cables includes a plurality of remote sensors connected with the communication cables at spaced locations for monitoring network data at the locations. Each remote sensor includes a unique identifier so that the location being monitored will be recognized. A central computer is connected with the remote sensors and analyzes data from each sensor. If a fault is detected at any sensor, the computer generates an output signal indicative thereof which may be displayed on a monitor.

The central computer includes a transmitter, a receiver, a comparator, and a storage device such as a memory in which baseline data for each location is stored. The transmitter sends sequential requests for measurement information to each of the remote sensors which in turn send measurement information corresponding to the network data at the location of the sensor to the receiver of the computer. The comparator compares the measurement information from each sensor with baseline data for each sensor and produces a fault signal when the measurement information differs from the baseline information. In this manner, the operator of the monitoring system will be able to quickly detect where a fault in the communication system has occurred.

Each remote sensor includes a receiver for receiving requests for measurement data, a microprocessor for producing the measurement information as a function of the network data at the location, and a transmitter for transmitting measurement information to the central computer.

The communication system is bi-directional and the remote sensors are capable of monitoring network data flowing in both directions. The measurement requests and information transmitted between the remote sensors and the central computer do not interfere with the bi-directional data transmitted through the communications network being monitored.

The invention further relates to a method for monitoring a wired communications network in a tunnel environment such as within a subway system. According to the method, communication cables of the network are tapped at spaced locations and the network data at each tapped location is monitored. Signals corresponding to the monitored network data are compared with baseline data. Where there is a variance in the monitored data from the baseline data, a fault is indicated.

BRIEF DESCRIPTION OF THE FIGURES

Other objects and advantages of the invention will become apparent from a study of the following specification when viewed in the light of the accompanying drawing, in which.

DETAILED DESCRIPTION

Figure 1:
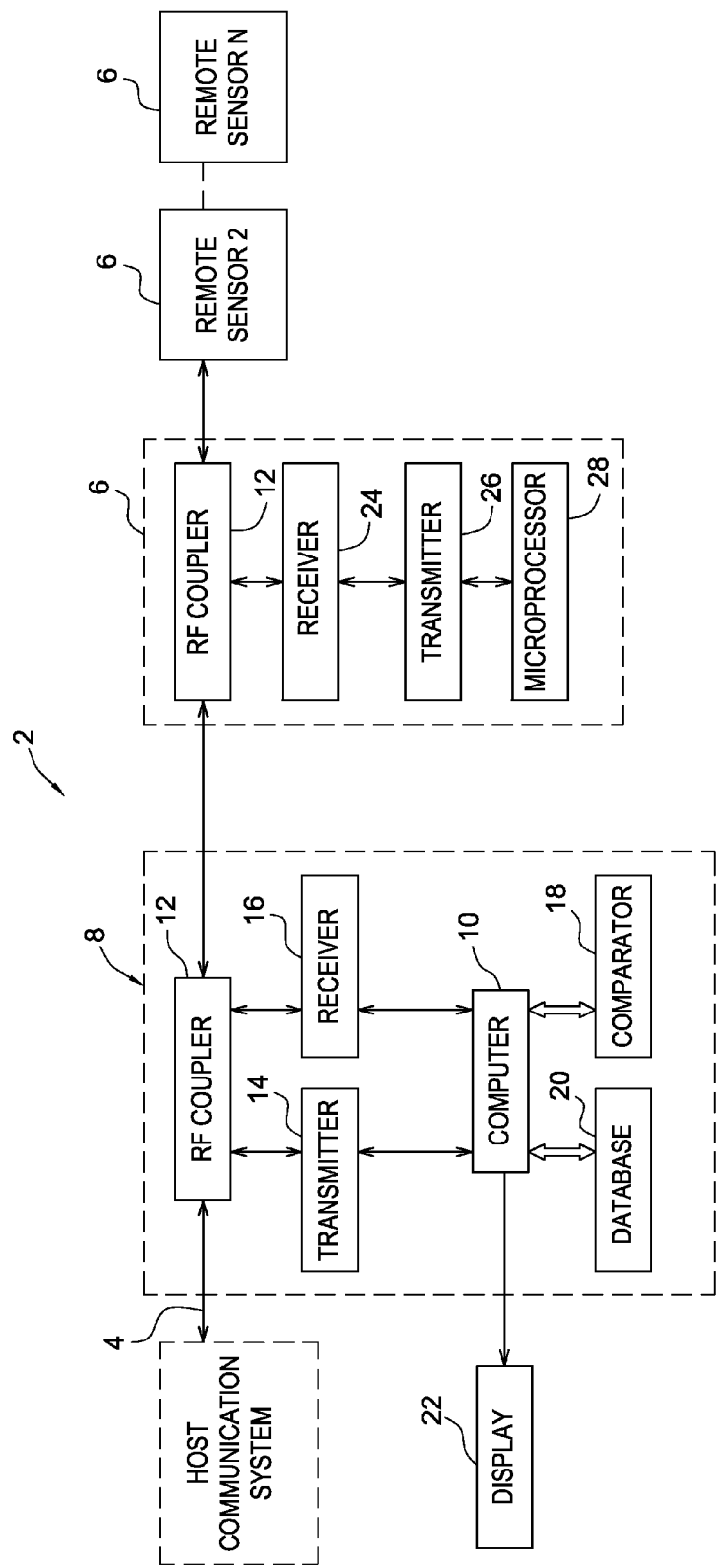
FIG. 1 is block diagram of the communications network monitoring system according to a preferred embodiment of the invention.

Referring first to FIG. 1, the monitoring system 2 according to a preferred embodiment of the invention will be described. The system is used to monitor the performance of a communication network 4 or a radio frequency (RF) distribution network in a building, subway system or other tunnel environment. The network is a wired network comprising a plurality of cables.

The monitoring system includes a plurality of remote sensors or units 6 which are connected with the communication cables of the underlying network at spaced locations for monitoring bi-directional RF signals containing network data at each location. The number N of remote sensors is variable in accordance with the size of the network. Each remote sensor has a unique identifier so that the location being monitored can be defined. The remote sensors are connected with an RF controller 8 including a central computer 10. The computer polls each of the remote sensors and analyzes RF performance levels and data received from each sensor in response to the polling query. The computer stores the pertinent data, displays the levels for both the uplink and the downlink and produces an output signal when a fault is detected with respect to signals and data at one of the remote sensors.

Network data collected by the plurality of remote sensors is bi-directional and includes both data regarding the performance of the downlink (Base to Mobile) and the uplink (Mobile to Base) of the network transmissions. Knowledge of the performance of bi-directional levels is essential as communication networks and RF networks in a building, subway system and tunnels have different characteristics in the uplink versus the downlink and degradation of either link must be determined in order to perform maintenance of the underlying communication network.

The RF controller includes an RF coupler 12 for connection with the underlying communication network, a transmitter 14 for sequentially sending requests for measurement information from the central computer to each remote sensor via the downlink signal and a receiver 16 for receiving the measurement information from the sensor relative to the level of the downlink signal and measuring the amplitude of the received transmission of the uplink signal at the central computer. The measurement information is delivered to the computer 10. One of the functions of the computer is to calculate the gain and loss of the uplink signal using the measurements of the uplink signal level as reported by the RF Controller. Another of the functions of the computer is to calculate the gain and loss of the downlink signal using the measurements of the downlink signal made by the remote sensor. The computer also serves as a comparator 18 between the incoming data and calculations of gain and loss for both the uplink and the downlink signals and information stored in a data base 20 for each remote sensor. Thus, the computer is operable to compare measurement information and gain/loss information from each remote sensor with baseline measurement information for that sensor. The comparator generates a fault output signal when the measurement information or gain/loss information differs from the baseline information by a selected order of magnitude. The fault signal is delivered to a display 22. An operator of the monitoring system can thus determine not only when a fault occurs in the network being monitored but also the location of the fault. This facilitates a quick response and repair to the network.

The computer also displays levels and gains for each sensor in the system so that an operator can determine if gradual degradation is occurring in the underlying system. The computer assists with this by identifying any sensors with both warnings and alarms should performance of the underlying network be less than normal performance.

Each remote sensor 6 includes an RF coupler 12, a receiver 24, a transmitter 26, and a microprocessor 28. The RF coupler 12 that lightly couples the primary cable while providing sufficient attenuation for the receiver and the transmitter. The receiver receives requests for measurement information which are generated by the computer and transmitted by the computer transmitter. The microprocessor 28 in each remote sensor produces the measurement information as a function of the network data at the location of the remote sensor. The transmitter 26 in the remote sensor transmits the measurement information at a predetermined transmit level for the downlink signal. The RF Controller measures the uplink signal level and extracts the downlink data that was transmitted by the sensor, and this information is passed to the central computer. The frequency of measurement and transmission are controlled by command from the central computer, thus allowing the measurement of any of the RF carriers on the downlink.

Installation of the monitoring system according to a preferred embodiment of the invention will now be described with reference to FIGS. 2 and 3. The monitoring system is preferably a real time monitoring and control system which includes a plurality of taps at a plurality of interfaces along the communications network and/or radio frequency distribution network. The communications network includes a distribution center 30 having a plurality of communication cables 32 connected therewith. This communications network is interfaced to a host base station 34. A radio frequency (RF) control device 36 is connected with the distribution center. The RF control device is connected with a data network 38 which in turn is connected with a master terminal 40. The master terminal includes the display on which faults are indicated to the operator. A remote sensor 42 can be inserted into the RF path from the host base station 34 to the distribution center. The central computer of the monitoring system may be located in the host base station or at any portion of the infrastructure where access to the data network is available.

The communication cables 32 of the underlying network comprise coaxial cables, radiating cables, fiber-optic distribution cables and bi-directional amplifiers 44 for boosting the signals or data transmitted thereby. For example, the communication may comprise voice communications over FM radio and digital FM radio via a wired network, typically via co-axial cable. Fire, police and public service operations are typically in the 160 to 870 Megahertz range and are various types of communications on the network.

A plurality are taps is utilized to periodically tap off the signal being transmitted at various spaced intervals along the network. Using a remote sensor 6 at each of a plurality of taps, real time monitoring of the network is accomplished. Each remote sensor contains a unique permanent address or identifier. The receiver and transmitter of the remote sensor use a built-in look up table within the microprocessor which is able to compensate for temperature variations and correct for ambient changes in the surrounding environment, thereby improving accuracy of the network measurement data collected. The period of measurement is controlled to reduce impacts of noise and modulation on the network.

The microprocessor of each remote sensor can be modified by downloading updates and upgrades from the central control computer into the remote sensor.

Figure 2:
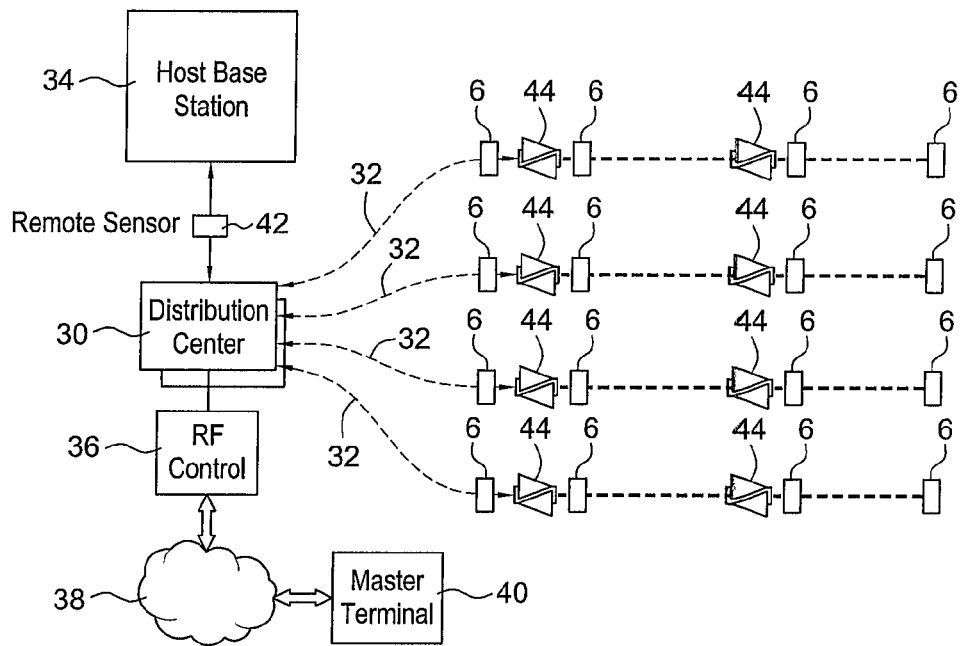
FIG. 2 is a block diagram of a communications network incorporating the monitoring system according to the invention.

The communication network shown in FIG. 2 includes a plurality of bi-directional amplifiers 44 in each communication line 32. The taps for the remote sensors 6 may be arranged on either side of each bi-directional amplifier or only at one side of each bi-directional amplifier as shown, with an additional unit at the end of each line.

Figure 3:
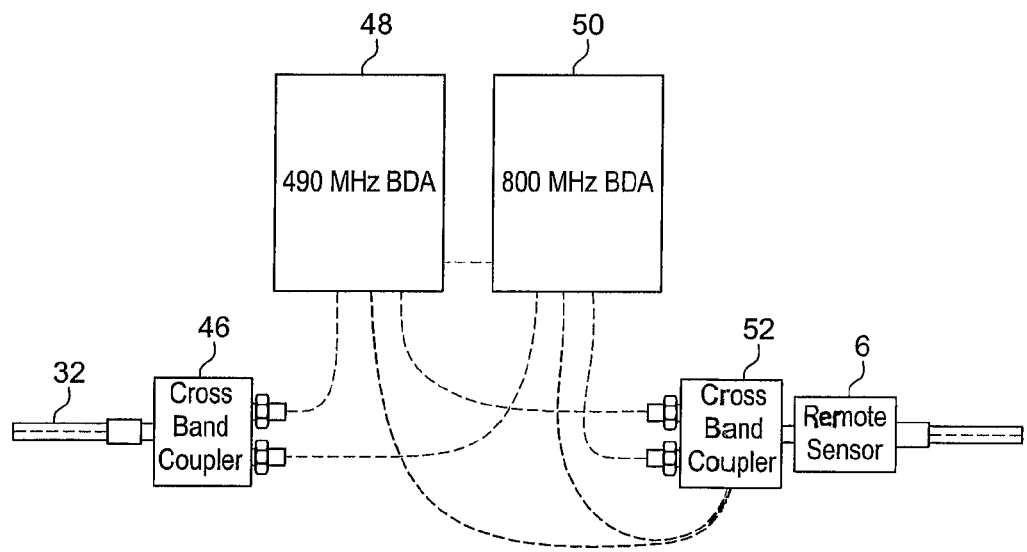
FIG. 3 is a detailed block diagram illustrating how a remote sensor of the monitoring system is connected with the communications network being monitored according to one embodiment of the invention.

FIG. 3 illustrates an example of the connection of a remote sensor with the communication line 32 in the form of a coaxial cable. A cross-band coupler 46 is connected with the line and has two outputs which are connected with the amplifiers 48, 50 which comprise the bi-directional amplifier 44 shown in FIG. 2. The amplifiers 48, 50 in turn are connected with a second cross-band coupler 52. The remote sensor 6 is connected between the cross-band coupler 52 and the co-axial cable. If desired, a further sensor (not shown) can be connected between the coupler 46 and the co-axial cable. In addition, the bi-directional amplifiers may be omitted if desired.

Figure 4:
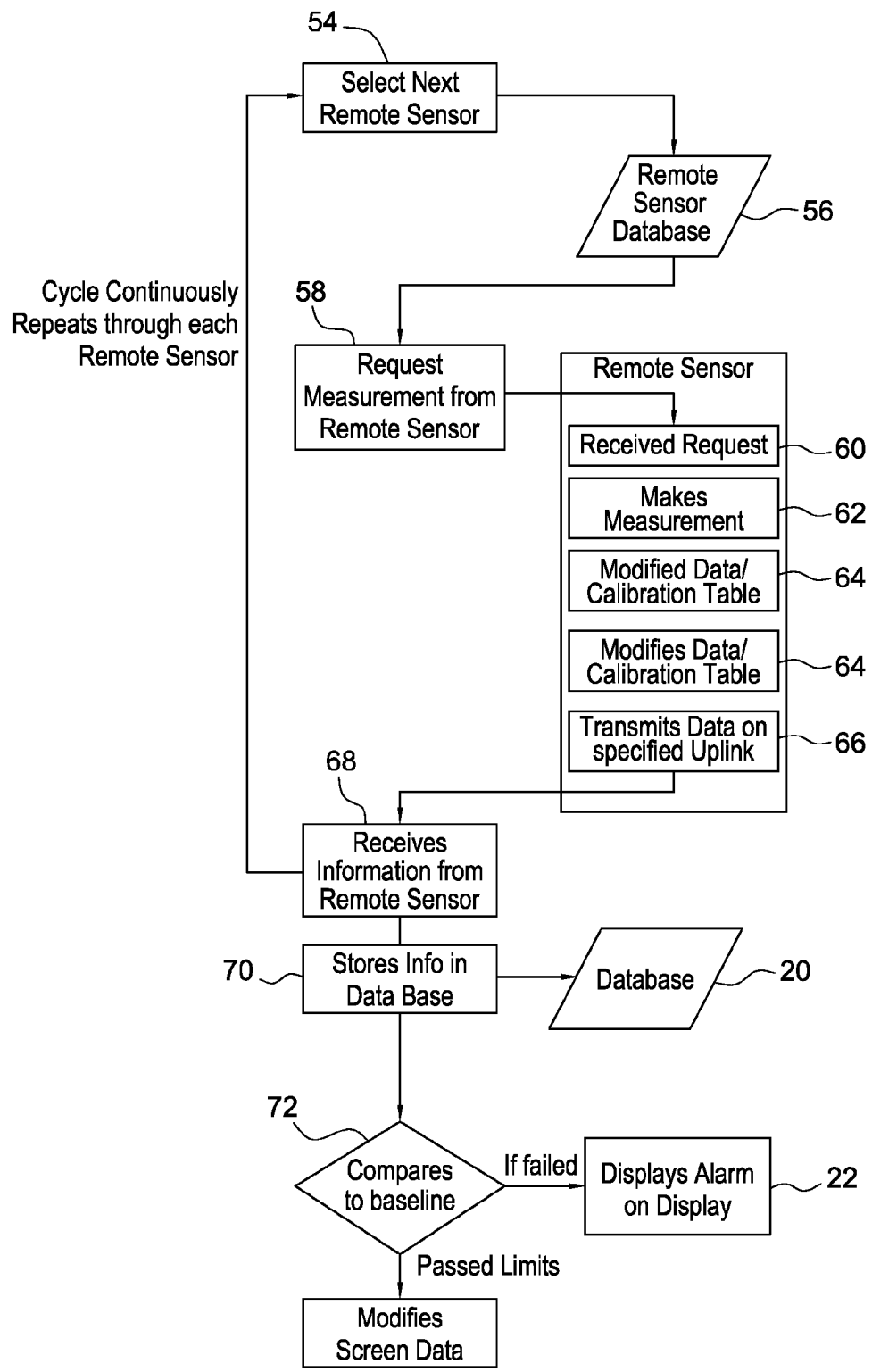
FIG. 4 is a flow chart illustrating a preferred method for monitoring a communications network according to the invention.

The method for monitoring a communications network using the monitoring system according to the invention will be described with reference to FIG. 4. The central computer cycles through the various remote sensors sequentially. A specific sensor at a given location is selected at step 54 from a database 56 containing the location of all of the remote sensors. A measurement request signal 58 is transmitted to the selected sensor from the transmitter of the central computer. The remote sensor receives the request signal 60, takes a measurement 62 of the data from the network for the downlink signal, modifies the measured data using calibration tables 64, and transmits the measurement data 66 of the downlink signal to the central computer. The remote sensor also measures the uplink signal and transmits that measurement to the central computer.

Data collected and measured by the remote sensors may include signal levels and frequencies of the network transmissions at each of the plurality of taps. The measurement frequency may be controlled so that specific operational traffic channels may be monitored or the magnitudes of the monitoring network command frequency may be measured.

The receiver of the central computer receives the measurement data 68 and stores the data 70 in the data base 20 of the computer. The measurement data for the downlink signal at the central computer is used along with measurement data for the downlink signal made at the remote sensor to calculate gain/loss of the downlink signal. The measurement data for the uplink signal at the RF controller is used along with a sensor transmit level to calculate gain/loss of the uplink signal. The measurement data is compared 72 with baseline data from the data base. If the comparison shows a deviation from the baseline data, a fault or alarm signal is displayed on the display 22.

By utilizing the uplink band of the underlying system the gains and losses from the remote sensor may be calculated at the central computer and compared to prior baseline information in the computer data base to determine the performance of the uplink.

The system operates in a non-interfering manner with the network. Frequency synthesizers in the receiver and the transmitter of the remote sensor allow for selection of frequencies that will not interfere with the network being monitored. The receiver uses narrow band IF filtering to minimize the impact of carriers operating in adjacent bands. All of the operational frequencies of the monitoring system can be altered by commands from the computer should interference with the underlying network occur.

The microprocessor within each remote sensor averages a number of samples to establish a valid measurement of the signal level. The resolution of this measurement is improved by varying the gain in a synchronous manner with the measurement cycle and providing the appropriate offset to compensate for the induced amplitude change.

Each remote sensor makes measurements and responds with the information requested when polled.

The microprocessor 28 in each remote sensor stores a calibration table for the receiver 24 and applies these corrections to the measurement made by the receiver when responding to the measurement request.

The system is controlled from the central control computer, for example, a conventional personal computer, which is programmed to manage, analyze, report and display network data being collected regarding performance and maintenance status of the network and to provide instructions regarding control of the network.

The remote sensor is equipped with the capability of passing messages from the computer to other equipment devices that are co-located with the remote sensor. This capability enables the control and monitoring of other equipment devices such as bi-directional amplifiers that are placed in difficult to reach places.

While the preferred forms and embodiments of the invention have been illustrated and described, it will apparent to those of ordinary skill in the art that various changes and modifications may be made without deviating from the inventive concepts set forth above.

What is claimed is:

1. A system for monitoring a communications network including a plurality of communication cables, comprising
    (a) radio frequency controller for transmitting downlink data communication signals from a host communication system and requests for measurement via the communication cables;
    (b) a plurality of sensors each having a unique identifier connected with the communication cables at sequentially spaced locations along the communication cables and configured to monitor and measure an amplitude of said bi-directional modulated radio frequency signals at said locations within the network and to transmit the measured amplitudes via uplink signals, respectively, in response to said requests for measurement, wherein said requests for measurement and said measurement information do not interfere with data signals transmitted within the communications network; and
    (c) a central computer connected with said radio frequency controller and including a comparator configured to receive said uplink signals from said sensors, analyze the amplitude of said bi-directional modulated radio frequency signals from said sensors, compare said measured amplitudes with a baseline amplitude for said signals, and generate a fault signal when a measured amplitude of said signals detected at one of said sensors deviates from the baseline amplitude by a predetermined amount, whereby separate quantitative measurements of gains and losses in uplink and in downlink modulated radio frequency signals are obtained.

2. A monitoring system as defined in claim 1, wherein said central computer further includes a database containing said baseline measurement information for each remote sensor.

3. A monitoring system as defined in claim 2, wherein each remote sensor includes a receiver for receiving said requests for measurement information from said central computer, a microprocessor for producing said measurement information as a function of network data at said location, and a transmitter for transmitting said uplink signals containing said measurement information to said central computer.

4. A monitoring system as defined in claim 3, wherein said central computer quantitatively measures the RF performance of the signal levels throughout the communications network.

5. A monitoring system as defined in claim 4, and further comprising a plurality of spaced bi-directional amplifiers connected with said communications cables adjacent to said sensors.

6. A method for monitoring a communications network having a plurality of wired communication cables for transmitting data communications signals, comprising the steps of
    (a) tapping the communication cables at spaced locations;
    (b) monitoring and measuring the amplitude of downlink data communication signals via sensors at each of said spaced locations;
    (c) comparing the monitored measured amplitude of the data communication signals from uplink signals from said spaced locations with a baseline amplitude for the data communication signals in a computer; and
    (d) generating a fault indication from the computer when said measured amplitude for the data communication signals at one of said locations varies from said baseline amplitude for the data communication signals.

7. A method as defined in claim 6, wherein said monitoring step occurs sequentially at each of said spaced locations.

8. A method as defined in claim 7, wherein said monitoring step does not interfere with the data communication signals transmitted within the communications network.

9. A method as defined in claim 8, wherein said monitoring step includes measuring the flow of data at each location.

10. A method as defined in claim 9, wherein the communications system is bi-directional and said monitoring step includes monitoring network data communication signals flowing in both directions.

11. A method as defined in claim 10, wherein said communications network comprises a radio frequency network.

* * * * *